(12) United States Patent
Lukanc et al.

(10) Patent No.: US 7,015,148 B1
(45) Date of Patent: Mar. 21, 2006

(54) REDUCE LINE END PULL BACK BY EXPOSING AND ETCHING SPACE AFTER MASK ONE TRIM AND ETCH

(75) Inventors: Todd P. Lukanc, San Jose, CA (US); Luigi Capodieci, Santa Cruz, CA (US); Christopher A. Spence, Sunnyvale, CA (US); Joerg Reiss, Sunnyvale, CA (US); Sarah N. McGowan, San Francisco, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/852,883

(22) Filed: May 25, 2004

(51) Int. Cl.
    *H01L 21/302* (2006.01)
    *H01L 21/461* (2006.01)
(52) U.S. Cl. .................. 438/736; 438/720
(58) Field of Classification Search ........... 438/720, 438/742, 736
    See application file for complete search history.

(56) References Cited

U.S. PATENT DOCUMENTS

| | | | | |
|---|---|---|---|---|
| 6,022,815 A * | 2/2000 | Doyle et al. | ............... | 438/596 |
| 6,249,904 B1 | 6/2001 | Cobb | ............... | 716/21 |
| 6,335,128 B1 | 1/2002 | Cobb et al. | ............... | 430/5 |
| 6,391,525 B1 * | 5/2002 | Lyons | ............... | 430/311 |
| 6,430,737 B1 | 8/2002 | Cobb et al. | ............... | 716/19 |
| 6,455,205 B1 | 9/2002 | Cobb et al. | ............... | 430/5 |
| 6,467,076 B1 | 10/2002 | Cobb | ............... | 716/19 |
| 6,516,459 B1 | 2/2003 | Sahouria | ............... | 716/21 |
| 6,643,616 B1 | 11/2003 | Granik et al. | ............... | 703/13 |
| 6,664,173 B1 * | 12/2003 | Doyle et al. | ............... | 438/587 |
| 6,838,347 B1 * | 1/2005 | Liu et al. | ............... | 438/291 |

OTHER PUBLICATIONS

Claims from U.S. Appl. No. 10/852,876, Filing Date May 25, 2004.

* cited by examiner

*Primary Examiner*—Caridad Everhart
(74) *Attorney, Agent, or Firm*—Renner, Otto, Boisselle & Sklar, LLP

(57) ABSTRACT

The invention is a method of manufacturing a semiconductor device and such semiconductor device. The semiconductor device includes an integrated circuit pattern including a horizontal line, a vertical line and a space therebetween, the space including a precise width dimension. The method includes the steps of: forming a photosensitive layer to be patterned, patterning the photosensitive layer to form a pattern including a master horizontal line and a master vertical line without a space therebetween, transferring the pattern to at least one underlying layer using the patterned photosensitive layer, forming a second photosensitive layer over the patterned at least one underlying layer, patterning the second photosensitive layer to form a second pattern including a master space aligned to dissect a horizontal line and a vertical line formed in the at least one underlying layer, and transferring the second pattern to the at least one underlying layer to form a third pattern including a horizontal line and a vertical line with a space therebetween, the space including a precise width dimension.

17 Claims, 3 Drawing Sheets

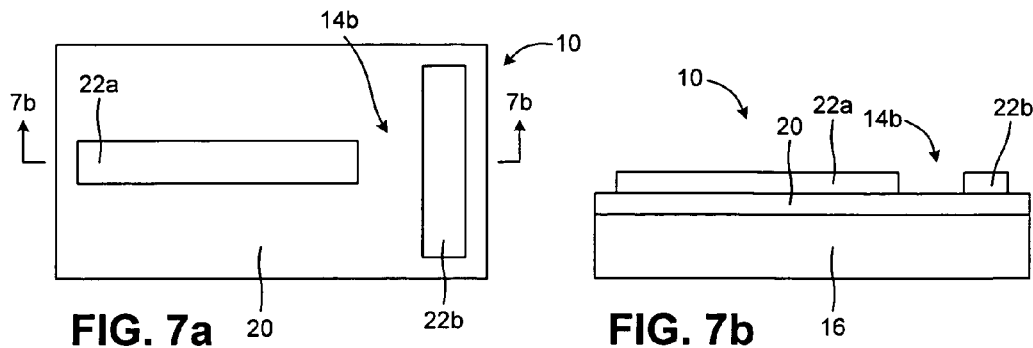
FIG. 7a  FIG. 7b
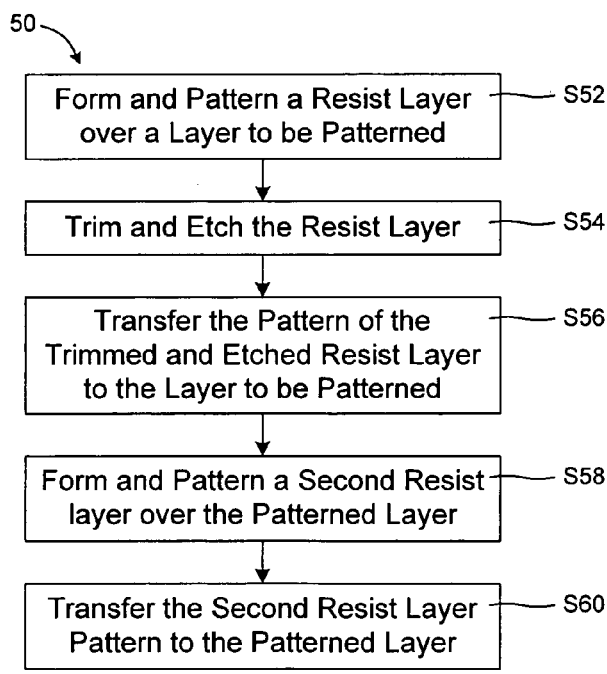
FIG. 8

REDUCE LINE END PULL BACK BY EXPOSING AND ETCHING SPACE AFTER MASK ONE TRIM AND ETCH

TECHNICAL FIELD

The present invention generally relates to the manufacture of semiconductor devices and, more specifically, relates to the manufacture of semiconductor devices to reduce line end pull back by exposing and etching space after mask one trim and etch.

BACKGROUND ART

Various semiconductor devices are manufactured on semiconductor substrates, e.g., a field effect transistor, a floating gate FLASH memory cell, a SONOS (Silicon/Oxide/Nitride/Oxide/Silicon) type FLASH memory device or the like. Such devices continue to be scaled in order to increase the number of devices formed on a chip that forms an integrated circuit (IC). Given the continuing trend towards miniaturization and increased integration of devices on an integrated circuit chip, the capability to manufacture the substructures precisely and with high quality is of increasing importance.

A vertical stack of non-conductive material and conductive material formed sequentially over a semiconductor substrate characterizes field effect transistors. Specifically, the vertical stack includes a gate electrode formed over a gate dielectric. The gate electrode defines a channel within a doped region interposed between a source and a drain formed in the semiconductor substrate.

Subsequently, floating gate FLASH memory types of EEPROMs (electrically erasable programmable read-only memory) have been produced. EEPROMs employ a FLASH memory cell formed over a semiconductor substrate. The FLASH memory cell is characterized by a vertical stack of a tunnel oxide, a first polysilicon layer (charge trapping conducting layer, i.e., a floating gate) over the tunnel oxide, an ONO (oxide-nitride-oxide) intergate dielectric over the first polysilicon layer, and a second polysilicon layer (i.e., a control gate) over the ONO intergate dielectric. The floating gate defines a channel within a doped region interposed between two bitlines formed in the semiconductor substrate. The bitlines, as described above, are doped regions that may act as either a source or a drain.

More recently, SONOS (Silicon/Oxide/Nitride/Oxide/Silicon) type FLASH memory devices have been produced. The SONOS type FLASH memory cells are also characterized by a vertical stack formed over a semiconductor substrate. The SONOS vertical stack includes a charge trapping non-conducting dielectric layer, typically a silicon nitride layer, sandwiched between two silicon dioxide layers (insulating layers), i.e., a lower silicon dioxide layer and an upper silicon dioxide layer.

The charge trapping non-conducting dielectric layer functions as an electrical charge trapping medium. The charge trapping non-conducting dielectric layer may have two separated and separately chargeable areas, i.e., a left bit and a right bit. Each area defines one bit.

A conducting gate layer, i.e., a control gate, is formed over the upper silicon dioxide layer. The SONOS type FLASH memory cell has a lightly doped region (the channel) between two bitlines, i.e., a left bitline and a right bitline (it should be understood by those having ordinary skill in the art that the terms source and drain could be used interchangeably with the term bitlines in this context). The left bitline or the right bitline may act as either a source or a drain. An electrical charge may be trapped locally, i.e., in either the left bit or the right bit, near whichever bitline is used as a drain.

The devices are formed using known semiconductor processing techniques to deposit one or more layers of dielectric material and conductive material sequentially based on the device to be made. Next, the one or more layers are patterned and etched to form the gate stacks described above. The etching process is typically multiple etching steps. An etchant species is selected for a particular etch step that is selective between the material to be etched and the material which is to remain relatively unetched.

For illustrative purposes, the process for forming an EEPROM memory cell is described as follows: forming an ONO dielectric over a semiconductor substrate, depositing polysilicon over the ONO dielectric, and patterning and etching the polysilicon to form gate electrodes or wordlines.

The patterning and etching of the polysilicon is usually accomplished by depositing and patterning a photosensitive layer over the polysilicon to form a lithographic image in the photosensitive layer, i.e., a photosensitive mask. Next, portions of polysilicon exposed by apertures in the photosensitive mask are etched/removed. Then, the photosensitive mask is removed to expose the patterned polysilicon. Thus, polysilicon wordlines/gate electrodes are formed over the ONO dielectric.

Unfortunately, as manufacturers scale down the device dimensions to increase the performance and reduce the cost of manufacture, the scaling down of devices has led to the development of several undesirable results during the processing of the semiconductor devices. For example, as the dimensions of the horizontal and vertical lines and the spaces therebetween of an IC are reduced, the ability to produce the horizontal and vertical lines and the spaces therebetween with precise dimensions is limited. As is understood by those having ordinary skill in the art, the length dimensions of the horizontal and vertical lines of a mask are reduced in the lithographic image produced in the photosensitive layer and subsequently in a device layer to be patterned due to many variables, e.g., the illumination conditions at the line ends, the quality of the photosensitive mask produced, variations in the thickness of the photosensitive mask, the etchant species used or a combination thereof. In cases where wafer area is not a limiting factor, the length of the vertical and horizontal lines can be extended on the mask to account for line end pull back. For example, to produce a 100 nm line in a device layer, a 100 nm line on the mask would be extended 15 nm on each end (30 nm total) to account for a 15 nm reduction at each line end. However, a line may not be extended when there are horizontal and vertical lines in close proximity and an extension of one line would cause the extended line to intersect another line. Accordingly, a device produced from such a mask may be inoperative or the operation of such device may be significantly degraded.

In an attempt to overcome this problem, mask designers design masks to prevent the intersection of an extended line with another line. That is, a mask is produced with a space between the horizontal and the vertical lines. However, due to line end pull back, the space increases between the horizontal and the vertical lines in the device layer resulting in a space greater than desired. As a result, a significant amount of wafer area will be wasted and the number of devices that can be produced from the wafer significantly decreased.

Therefore, there exists a strong need in the art for a method which produces semiconductor devices that reduce the effects due to line end pull back. There is also a need to produce precise features in a layer to be patterned. Further, there is a need to produce the features with a precise space therebetween. Further still, there is a need to produce precise features with dimensions that cannot be achieved using lithography processes alone. Such an invention would allow the further scaling of semiconductor devices and increase performance.

DISCLOSURE OF INVENTION

According to one aspect of the invention, the invention relates to a method a semiconductor device including the steps of: forming a photosensitive layer to be patterned, patterning the photosensitive layer to form a pattern including a master horizontal line and a master vertical line without a space therebetween, transferring the pattern to at least one underlying layer using the patterned photosensitive layer, forming a second photosensitive layer over the patterned at least one underlying layer, patterning the second photosensitive layer to form a second pattern including a master space aligned to dissect a horizontal line and a vertical line formed in the at least one underlying layer, and transferring the second pattern to the at least one underlying layer to form a third pattern including a horizontal line and a vertical line with a space therebetween, the space including a precise width dimension.

According to another aspect of the invention, the invention relates to a method of forming a semiconductor device including the steps of: forming a patterned photosensitive layer including an integrated circuit (IC) pattern over a substrate, the IC pattern including a master horizontal/vertical line pattern without a space therebetween, transferring the master horizontal/vertical line pattern without a space therebetween to at least one underlying layer using the patterned photosensitive layer, forming a second patterned photosensitive layer including a second IC pattern over the patterned at least one underlying layer, the second IC pattern including a space pattern including at least one master space including a width dimension at the lithography limit, and transferring the space pattern to the patterned at least one underlying layer using the second patterned photosensitive layer, a space in the at least one underlying layer, the space includes a width dimension about equal to a width dimension of the at least one master space in the second patterned photosensitive layer.

BRIEF DESCRIPTION OF DRAWINGS

These and further features of the present invention will be apparent with reference to the following description and drawings, wherein:

FIGS. 7a and 7b are a top-view and a cross-sectional view, respectively, of the device of FIG. 1 at an intermediate stage of manufacture; and FIG. 8 is a flow chart highlighting steps of the manufacturing process.

Figure 1A:
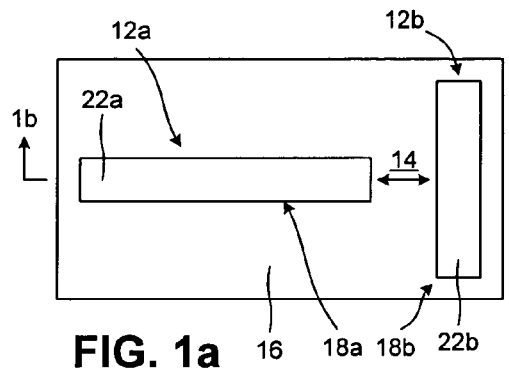
FIG. 1a is a top-view of a semiconductor device that includes a feature formed using a photoresist mask to reduce line end pull back in accordance with one embodiment of the present invention.

To illustrate the present invention in a clear and concise manner, the drawings may not necessarily be to scale and certain features may be shown in a partial schematic format. Additionally, in the detailed description that follows, identical components have been given the same reference numerals. For the sake of brevity, in-depth descriptions of similar components may be omitted from descriptions of the subsequent embodiments.

MODE(S) FOR CARRYING OUT THE INVENTION

Figure 1B:
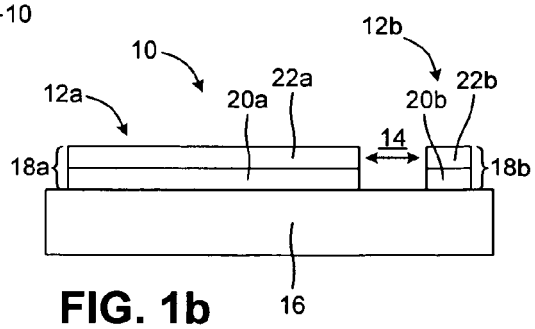
FIG. 1b is a cross-sectional view of the semiconductor device of FIG. 1 taken along the lines indicated by the labeled arrows.

Referring initially to FIGS. 1a and 1b, a top view and a corresponding cross-sectional view taken along the lines indicated by the arrows in FIG. 1, an illustrative structure resulting from the method of the present invention is shown, generally designated as 10. The structure 10 includes features and sub-features that form an integrated circuit (IC), for example, a horizontal line 12a, a vertical line 12b and a space 14 therebetween. Each feature and/or sub-feature includes a precise width dimension or critical dimension (CD). The CD of the space 14 therebetween is achievable by lithography processes alone. The method that produces the structure 10 reduces the effects from line end pull back by exposing and etching a space with a width dimension achievable by lithography processes alone after a trim and etch of mask one as further explained below. Such a method can be incorporated into present lithography processes. Further, the invention allows for further scaling of semiconductor devices. Additionally, the invention increases the performance of such semiconductor devices.

The structure 10 will be described below in relationship to a semiconductor device. Although the structure 10 may also be referred to as semiconductor device 10, those having ordinary skill in the art will appreciate that the invention applies to the formation of features and sub-features over a substrate that require a space therebetween including a CD achievable by lithography processes alone. Further, as is understood by those having ordinary skill in the art, an IC pattern may include several horizontal and vertical lines requiring a precisely dimensioned space therebetween.

The semiconductor device 10 includes a semiconductor substrate 16. The horizontal line 12a, the vertical line 12b and the space 14 therebetween are formed over the semiconductor substrate 16. The horizontal line 12a and the vertical line 12b include a horizontal gate stack 18a and a vertical gate stack 18b, respectively (two gate stacks are illustrated in FIG. 1). The space 14 includes a width dimension (critical dimension (CD)) that is the smallest width dimension achievable at the resolution limit of lithography. The horizontal line 12a, the vertical line 12b and the space 14 form a horizontal/vertical line and space pattern on the substrate 16. The alignment of the horizontal line 12a and the vertical line 12b is such that if the horizontal line 12a was extended, the horizontal line 12a would intersect the vertical line 12b.

The horizontal gate stack 18a includes a horizontal dielectric layer 20a interposed between a gate electrode 22a formed from a conductive layer 22. The vertical gate stack 18b includes a vertical dielectric layer 20b interposed between a gate electrode 22b also formed from the conductive layer 22. As further explained below, a semiconductor device process is used to form the individual gate electrodes 22a and 22b from the conductive layer 22.

The dielectric layer 20 may comprise multiple layers (not shown). The multiple layers of such a dielectric layer 20 may include a tunneling layer, a charge-trapping layer and an insulating layer. The tunneling layer is interposed between the charge-trapping layer and the semiconductor substrate. The charge-trapping layer is interposed between the insulating layer and the tunneling layer. Over the insulating layer, the gate electrodes are formed from the conductive layer.

The resulting semiconductor device 10 has a gate pattern including the space 14. The space 14 has a width dimension that is the smallest width dimension achievable by lithography processes alone, i.e., a space critical dimension. In one embodiment, the gate electrodes 22a and 22b have a width dimension that is less than the smallest width dimension achievable by lithography processes alone, i.e., a gate electrode critical dimension.

Thus, the semiconductor device 10 is formed including a horizontal/vertical line and space pattern including a space 14 with a CD achievable by lithography processes alone. Further, the method of manufacturing the semiconductor device 10 significantly increases the yield of gate stacks 18a and 18b on the semiconductor substrate 16. Moreover, the method forms the semiconductor device 10 including gate electrodes 22a, 22b and spaces 14 including precise widths. Further still, gate stacks 18a and 18b including faster operating speeds may be achieved. Furthermore, more gate stacks 18a and 18b can be produced on a substrate. In addition to that, the method extends the use of current lithography processes and apparatuses.

The steps of a method 50 for fabricating a semiconductor device 10 are outlined in the flow chart shown in FIG. 8. FIGS. 2a, 2b, 3a, 3b, 4a, 4b, 5a, 5b, 6a, 6b, 7a and 7b illustrate various steps of the method 50. It will be appreciated that the method 50 and the semiconductor device 10 described below are merely exemplary, and that suitable embodiments of the many below described variations in materials, thicknesses, and/or structures may alternatively be used in the method 50 and/or the semiconductor device 10.

Figure 2A:
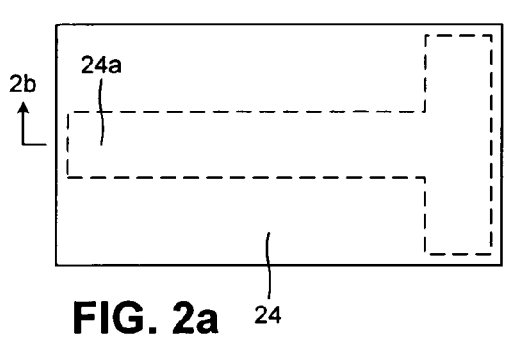
FIGS. 2a and 2b are a top-view and a cross-sectional view, respectively, of the device of FIG. 1 at an intermediate stage of manufacture.
Figure 2B:
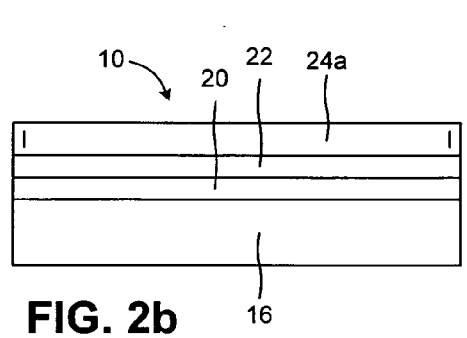

In Step S52, as represented in FIGS. 2a and 2b, a structure representing an intermediate step of the manufacturing process is shown. The method is initiated with the substrate 16. The substrate 16 may be of any material over which the dielectric layer 20 may be formed, as further described below.

For illustrative purposes, the substrate 16 is a bulk semiconductor substrate of silicon. The semiconductor substrate 16 includes an active region (not shown) extending from a surface of the semiconductor substrate 16 to a depth of about 3 nm.

Next, the dielectric layer 20 is formed over the semiconductor substrate 16. The dielectric layer 20 may be a single dielectric layer or a multi-layer dielectric layer. In one embodiment, the dielectric layer 20 may be a charge trapping dielectric layer comprising a tunneling layer, a charge trapping layer and an insulating layer. However, it should be understood by those having ordinary skill in the art that the charge trapping dielectric layer may comprise only two layers, e.g., the tunneling layer and the charge trapping layer, as further described below.

For illustrative purposes, the dielectric layer 20 is a single gate dielectric layer formed over the semiconductor substrate 16. The dielectric layer 20 may be of any dielectric material, e.g., silicon dioxide, silicon nitride or a high dielectric constant material relative to silicon dioxide or the like. The dielectric layer 20 may have a thickness of about 2.5 nm. The dielectric layer 20 may be deposited, e.g., by CVD, LPCVD or the like. Alternatively, the dielectric layer 20 may be grown using a thermal oxidation process.

Next, a liner layer (optional) (not shown) is formed over the dielectric layer 20. The liner layer functions as an etch stop layer. Accordingly, the liner layer may be of any material over which the conductive layer 22 may be formed and which can be used to stop an etch process of the conductive layer 22. For illustrative purposes, the liner layer is of silicon nitride. The liner layer has a thickness of about 1 nm. The liner layer is deposited by CVD.

Next, the conductive layer 22 is formed over the dielectric layer 20. For illustrative purposes, the conductive layer 22 may be, e.g., polysilicon, metal or other conductive material. The conductive layer 22 has a thickness of about 2.5 nm. The conductive layer 22 is deposited by CVD.

Next, an anti-reflective coating (ARC) (optional) (not shown) of silicon rich nitride (SiRN) is formed over the conductive layer 14. Other exemplary materials which may be used as the ARC include a SiON, a silicon rich oxide (SiRO), a disposable organic ARC or the like. The ARC is deposited by CVD, for example. The ARC is used when increased resolution of the lithography process is required.

Next, an imaging layer 24 of a photosensitive material is applied, for example, by spin-coating. The imaging layer 24 may have a thickness in the range of about 3 nm to about 10 nm, for example. Then, the imaging layer 24 is patterned by pattern-exposing using a conventional lithographic tool, developed, rinsed and dried. Thus, a pattern 24a is formed in the imaging layer 24 according to a pattern on a reticle (not shown). The pattern 24a includes a horizontal line intersecting a vertical line. The pattern, as viewed from above, appears to be in the shape of the letter "T" on the "T's" right side.

Next, the imaging layer 24 may be subjected to a hardening process to thermally stabilize the pattern 24a. Deep ultraviolet exposure or heat treatment at a temperature of about 200° C. to about 250° C. for about 1–2 minutes may be used for hardening. Another method of hardening the pattern 24a is by subjecting it to a halogen gas plasma. This hardening step is optional and may be needed for conventional photoresists, lest the photosensitive material constituting the pattern 24a may melt and flow or otherwise get degraded during the subsequent process.

Figure 3A:
FIGS. 3a and 3b are a top-view and a cross-sectional view, respectively, of the device of FIG. 1 at an intermediate stage of manufacture.
Figure 3B:
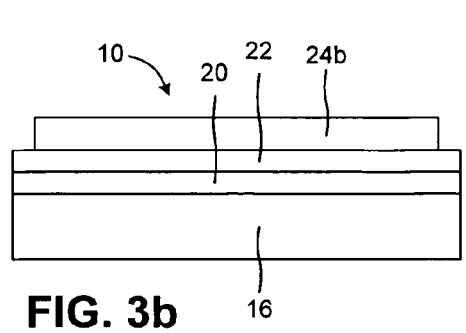

Next in step S54, as illustrated in FIGS. 3a and 3b, a trim and etch of the pattern 24a is performed. That is, an anisotropic etching is conducted to form the pattern 24b in the imaging layer 24. The pattern 24b is the photoresist mask 24b. The etchant removes the unexposed photosensitive material and some of the exposed photosensitive material leaving the photoresist pattern 24b. The photoresist pattern 24b, as viewed from above, appears to be in the shape of the letter "T" on the "T's" right side. The pattern 24b includes dimensions substantially smaller than the dimension of the "T" in the pattern 24a.

Figure 4A:
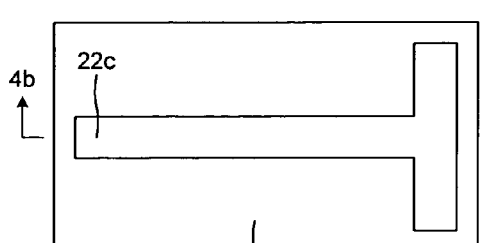
FIGS. 4a and 4b are a top-view and a cross-sectional view, respectively, of the device of FIG. 1 at an intermediate stage of manufacture.
Figure 4B:
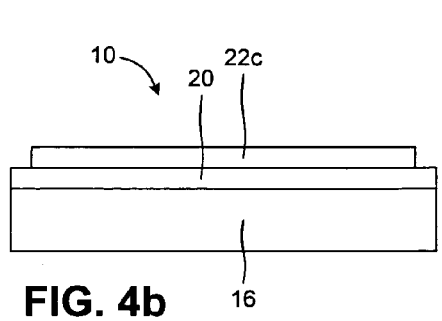

Next in Step S56, as illustrated in FIGS. 4a and 4b, the horizontal/vertical line pattern of the photoresist pattern 24b is transferred to at least one of the underlying layers by an anisotropic etching of the conductive layer 22. The etch step uses the patterned resist mask 24b as an etch mask. The conductive layer 22 may be etched using, for example, a CMP to remove the exposed conductive layer 22 from all the horizontal surfaces exposed by the resist mask 24b. Thus, an unetched portion 22c of the conductive layer 22 is left under the resist mask 24b. The unetched portion 22c of the conductive layer 22 will be formed into wordline(s)/gate electrodes 22a and 22b in a subsequent step described below.

Figure 5A:
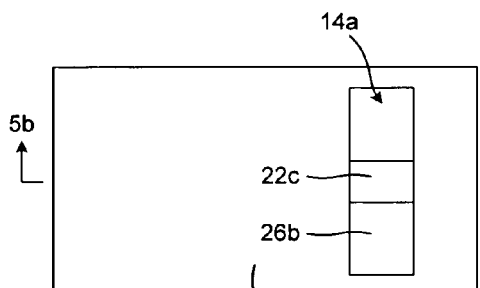
FIGS. 5a and 5b are a top-view and a cross-sectional view, respectively, of the device of FIG. 1 at an intermediate stage of manufacture.
Figure 5B:
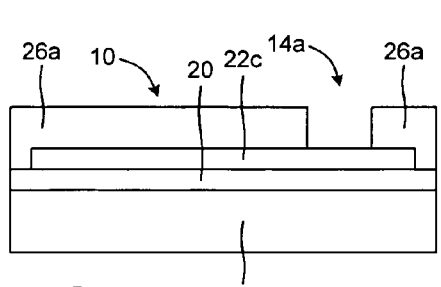

Next in step S58, as illustrated in FIGS. 5a and 5b, a second imaging layer 26a of a photosensitive material is applied, for example, by spin-coating. The second imaging layer 26a may have a thickness in the range of about 3 nm to about 10 nm, for example. Then, the second imaging layer 26a is patterned by pattern-exposing using a conventional lithographic tool, developed, rinsed and dried. Next, an anisotropic etching is conducted to form a space 14a in the second imaging layer 26a according to the pattern on a reticle (not shown). The space 14a exposes a portion of the unetched portion 22c at an intersection with a horizontal portion and a vertical portion of the unetched portion 22c and a portion of the photoresist 26b. The space 14a includes a width dimension preferably at the lithography limit. The vertical portion of the photoresist pattern 22b is still covered by the photoresist 26a.

Figure 6A:
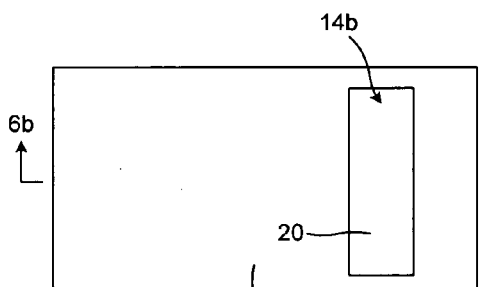
FIGS. 6a and 6b are a top-view and a cross-sectional view, respectively, of the device of FIG. 1 at an intermediate stage of manufacture.
Figure 6B:
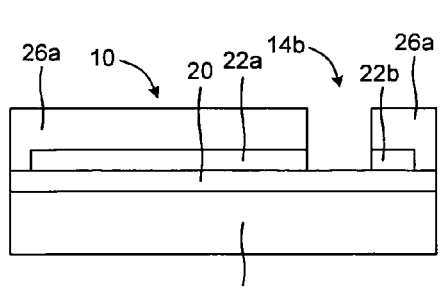

Next in Step S60, as illustrated in FIGS. 6a and 6b, an anisotropic etching is conducted to the exposed portion of the unetched portion 22c and the exposed imaging layer 26b to expose a surface of the dielectric layer 20. Thus, a space 14b of the pattern is formed. The space 14b, as viewed from above, dissects the "T" of the unetched portion 22c into a horizontal portion 22a and a vertical portion 22b. The space 14b includes a width dimension preferably at the lithography limit.

Next, as illustrated in FIGS. 7a and 7b, the resist mask 26a is removed from the semiconductor substrate 16. Subjecting the resist mask 26a to a suitable etchant, for example, a hot oxidizing acid such as nitric acid, sulphuric acid, hot phosphoric acid or a hot phenol removes the resist mask 26a. Alternatively, the resist mask 26a may be removed by oxygen plasma. Any of the resist mask 26a that remains may be removed by mechanical means, a plasma etch or washed off in a liquid base. It should be understood by those having ordinary skill in the art that the resist mask 26a may be removed, i.e., etched, with an etchant with a selectivity such that the gate dielectric will not be damaged by the etchant. For example, an etchant could be selected to stop on a nitride layer.

However, the etchant species must have a selectivity between the resist mask 26a and the gate electrodes 22a and 22b, as described above. The exposed liner layer, if formed, may be removed by an RIE, if desired. Alternatively, the etchant used may be an $O_2$ plasma, an argon plasma, a fluorine plasma or the like. Next, gate electrodes 22a and 22b may be used as a mask to etch the dielectric layer 20. Accordingly, the space 14 with the critical dimension achievable at the lithography limit is formed therebetween.

Now referring back to FIG. 1, the dimensions of the wordline(s)/gate electrodes 22a and 22b are approximately equal to the dimensions of the resist mask 24b (line) and 26a (space), respectively. Thus, the gate electrodes 22a and 22b and the space 14 include precise width dimensions. In one embodiment, gate electrodes 22a and 22b and the space 14 include a width dimension achievable at a resolution limit of lithography. In one embodiment, the gate electrodes 22a and 22b and the space 14 include a width dimension that is less than a width dimension achievable at a resolution limit of lithography. In one embodiment, the gate electrodes 22a and 22b include a width dimension that is less than a width dimension achievable at a resolution limit of lithography and the space 14 includes a width dimension achievable at a resolution limit of lithography. Accordingly, an integrated circuit is formed on the substrate 16 including the horizontal line 12a, the vertical line 12b and the space 14 therebetween including a precise width dimension.

Next, the semiconductor device 10 may be completed using conventional techniques known by those having ordinary skill in the art (not shown). For example, if the sidewalls of the non-volatile memory device are exposed, a spacer may be formed on a sidewall of the non-volatile memory cell. The spacer may be of an insulating film in consideration of the diffusion of the impurities in the lateral direction during the formation of the source and drain regions. Additionally, the semiconductor device 10, may be further isolated from other devices on the semiconductor substrate by a LOCal Oxidation of Silicon (LOCOS) oxide film or a trench device isolation film (shallow trench isolation, i.e., STI). Further, contacts may be formed to the non-volatile memory cell and the source and drain regions, or the like, to complete a working semiconductor device 10.

Another example of a device which may take advantage of a gate electrode including a precise width dimension and a space between the horizontal and vertical lines having a CD achievable at the limits of lithography, is a FLASH memory cell. In particular, the formation of a floating gate and/or the control gate for such a device. Such a FLASH memory cell would be capable of operating at significantly higher speeds than traditional FLASH memory cell devices formed by conventional techniques. Additionally, the scaling of the FLASH memory cell would allow a higher yield per wafer.

While the invention has been explained in relation to its preferred embodiments, it is to be understood that various modifications will become apparent to those skilled in the art upon reading the specification. It will further be appreciated that the semiconductor device 10 may alternatively have other shapes than the shapes shown in FIGS. 1a and 1b, for example. Therefore, it is to be understood that the invention disclosed herein is intended to cover such modifications as fall within the scope of the appended claims. Additionally, although the flow chart 50 of FIG. 8 shows a specific procedural order, it is understood that the procedural order may differ from that which is depicted. For example, the procedural order of two or more blocks may be reordered relative to the order shown. Also, two or more blocks shown in succession in FIG. 8 may be executed concurrently or with partial concurrence.

INDUSTRIAL APPLICABILITY

A semiconductor device fabricated using this process includes a wordline(s)/gate electrode(s) having a precise dimension. Additionally, the space between the horizontal and vertical lines includes a critical dimension obtainable by conventional lithography processes alone. In one embodiment, a semiconductor device includes a wordline(s)/gate electrode(s) having a width dimension, i.e., a critical dimension, obtainable by conventional lithography processes alone. In one embodiment, a semiconductor device includes a wordline(s)/gate electrode(s) having a width dimension, i.e., a critical dimension, less than a width dimension obtainable by conventional lithography processes alone. Such semiconductor devices would be capable of operating at significantly higher speeds than traditional semiconductor devices formed by conventional techniques. Additionally, the scaling of the semiconductor devices would allow a higher yield per wafer.

What is claimed is:

1. A method of forming a semiconductor device, the method comprising the steps of:
   forming a photosensitive layer to be patterned;
   patterning the photosensitive layer to form a pattern including a master horizontal line and a master vertical line without a space therebetween;
   transferring the pattern to at least one underlying layer using the patterned photosensitive layer;
   forming a second photosensitive layer over the patterned at least one underlying layer;
   patterning the second photosensitive layer to form a second pattern including a master space aligned to dissect a horizontal line and a vertical line formed in the at least one underlying layer;
   transferring the second pattern to the at least one underlying layer to form a third pattern including a horizontal line and a vertical line with a space therebetween, the space including a precise width dimension; and
   transferring the third pattern to at least one other underlying layer, wherein the at least one other underlying layer is a dielectric layer and the dielectric layer comprises a charge-trapping dielectric layer.

2. The method according to claim 1,
   wherein the precise width dimension is achievable at a resolution limit of lithography.

3. The method according to claim 1,
   wherein the precise width dimension is less than a width dimension achievable at a resolution limit of lithography.

4. The method according to claim 1, further comprising the steps of:
   using the patterned photosensitive layer as an etch mask to transfer the pattern to the at least one underlying layer.

5. The method according to claim 1,
   wherein the horizontal line and the vertical line include critical dimensions achievable by lithography processes alone.

6. The method according to claim 1,
   wherein the horizontal line and the vertical line include critical dimensions that are less than critical dimensions achievable by lithography processes alone.

7. The method according to claim 1,
   wherein the at least one underlying layer is a conductive layer.

8. The method according to claim 1, wherein the charge-trapping dielectric layer includes:
   a tunneling layer;
   a charge-trapping layer; and
   an insulating layer;
   wherein the tunneling layer is disposed over the substrate, the charge-trapping layer is disposed over the tunneling layer and the insulating layer is disposed over the charge-trapping layer.

9. A method of forming a semiconductor device, the method comprising the steps of:
   forming a photosensitive layer to be patterned;
   patterning the photosensitive layer to form a pattern including a master horizontal line and a master vertical line without a space therebetween;
   transferring the pattern to at least one underlying layer using the patterned photosensitive layer;
   forming a second photosensitive layer over the patterned at least one underlying layer;
   patterning the second photosensitive layer to form a second pattern including a master space aligned to dissect a horizontal line and a vertical line formed in the at least one underlying layer; and
   transferring the second pattern to the at least one underlying layer to form a third pattern including a horizontal line and a vertical line with a space therebetween, the space including a precise width dimension;
   wherein the at least one underlying layer comprises a gate stack formed on a substrate, the gate stack including:
   a gate dielectric layer disposed over the substrate; and
   a conductive layer disposed over the gate dielectric layer; and
   wherein the substrate comprises a germanium-on-insulator (GOI) structure including:
   a semiconductor substrate;
   an insulating layer disposed over the semiconductor substrate; and
   a semiconductive layer comprising germanium (Ge) disposed over the insulating layer.

10. The method according to claim 9, wherein the step of forming the conductive layer comprises the steps of:
    forming a conformal layer of a conductive material over an exposed surface of the gate dielectric layer; and
    anisotropically etching to remove exposed portions of the conductive material from horizontal surfaces of the substrate exposed by the patterned photosensitive layer.

11. A method according to claim 9,
    wherein the gate dielectric layer includes a gate dielectric material including a permittivity greater than a permittivity of silicon-dioxide ($Si_xO_y$).

12. The method according to claim 9,
    wherein the germanium (Ge) comprises crystalline germanium.

13. A method of forming a line feature for a semiconductor device having an end with reduced line end pullback, the end of the line feature formed adjacent and separated from a second feature, comprising:
    providing a substrate, at least one dielectric layer over the substrate, a conductive layer over the at least one dielectric layer and a first photo resist layer over the conductive layer, wherein the at least one dielectric layer includes a charge trapping layer for a memory device;
    patterning the first photo resist layer to form a photo resist pattern having a first portion corresponding to a preliminary line feature and a second portion corresponding to the adjacent second feature, the first portion connected to the second portion;
    trimming the photo resist pattern to reduce lateral and transverse dimensions of the photo resist pattern, the first portion and the second portion of the trimmed photo resist pattern remaining connected;
    transferring the trimmed photo resist pattern to the conductive layer so that the conductive layer includes a preliminary line feature connected to the adjacent second feature;

forming a second photo resist layer over the conductive layer;

patterning the second photo resist layer to include an opening that exposes a portion of the preliminary line feature and corresponds to the space between the end of the line feature and the adjacent second feature; and transferring the opening to the preliminary line feature such that a remaining portion of the preliminary line feature forms the line feature having the end formed adjacent and spaced apart from the second feature.

14. The method according to claim 13, wherein a desired size of the opening in the second photo resist layer is established without trimming of the second photo resist layer.

15. The method according to claim 13, wherein the charge trapping layer is disposed between a tunnel oxide layer and an insulating layer.

16. The method according to claim 13, wherein the end of the line has less line end pullback than if the line and adjacent second feature has been formed with separate and spaced apart photo resist features of the first photo resist layer.

17. The method according to claim 13, wherein the second feature is a line arranged perpendicular to the line feature.

* * * * *